(12) United States Patent
Tsai et al.

(10) Patent No.: US 6,968,613 B2
(45) Date of Patent: Nov. 29, 2005

(54) FABRICATION METHOD OF CIRCUIT BOARD

(75) Inventors: Chung-Che Tsai, Hsinchu (TW); Jin-Chuan Bai, Hsinchu (TW)

(73) Assignee: UltraTera Corporation, (TW)

( * ) Notice: Subject to any disclaimer, the term of this patent is extended or adjusted under 35 U.S.C. 154(b) by 496 days.

(21) Appl. No.: 10/176,122

(22) Filed: Jun. 20, 2002

(65) Prior Publication Data

US 2003/0182797 A1    Oct. 2, 2003

(51) Int. Cl.$^7$ .............................................. H01K 3/10
(52) U.S. Cl. ............................ 29/852; 29/846; 29/831; 29/842; 29/855; 29/840; 29/843; 216/13; 216/17; 216/18; 216/38; 216/40; 216/41; 216/49
(58) Field of Search ......................... 29/846, 831, 842, 29/855, 840, 843, 852; 216/13, 17, 18, 38, 216/40, 41, 83, 95, 49; 427/96–98

(56) References Cited

U.S. PATENT DOCUMENTS

| | | | | |
|---|---|---|---|---|
| 4,104,111 A | * | 8/1978 | Mack ........................... | 216/18 |
| 4,487,654 A | * | 12/1984 | Coppin ........................ | 216/18 |
| 4,720,324 A | * | 1/1988 | Hayward ..................... | 216/18 |
| 4,915,983 A | * | 4/1990 | Lake et al. .................. | 430/314 |
| 5,227,013 A | * | 7/1993 | Kumar ......................... | 216/18 |
| 5,347,712 A | * | 9/1994 | Yasuda et al. ................ | 29/852 |
| 5,487,999 A | * | 1/1996 | Farnworth ................... | 216/18 |
| 5,511,306 A | * | 4/1996 | Denton et al. ................ | 29/840 |
| 5,832,598 A | * | 11/1998 | Greenman et al. ........... | 29/840 |
| 6,014,805 A | * | 1/2000 | Buixadera Ferrer .......... | 29/852 |
| 6,233,817 B1 | * | 5/2001 | Ellis et al. ..................... | 29/832 |
| 6,389,689 B2 | * | 5/2002 | Heo ............................. | 29/840 |
| 6,432,748 B1 | * | 8/2002 | Hsu ............................. | 438/121 |
| 6,438,830 B1 | * | 8/2002 | Dibble et al. ................. | 29/876 |
| 6,634,100 B2 | * | 10/2003 | Akram et al. ................ | 29/874 |
| 6,651,324 B1 | * | 11/2003 | Pedretti et al. ............... | 29/846 |

\* cited by examiner

*Primary Examiner*—A. Dexter Tugbang
*Assistant Examiner*—Terri Lynn Smith
(74) *Attorney, Agent, or Firm*—Peter F. Corless; Steven M. Jensen; Edwards & Angell, LLP

(57) ABSTRACT

A fabrication method of a circuit board is proposed, wherein a core layer is formed with a plurality of conductive traces, and photo resist is respectively applied on terminals of the conductive traces. Then, a non-solderable material is applied over the core layer as to cover the conductive traces except for the insulating material, and the non-solderable material is adapted to be surface-flush with the insulating material, allowing the insulating material to be exposed from the non-solderable material. Finally, the insulating material is removed from the core layer to expose the terminals of the conductive traces, wherein the exposed terminals are used as bond pads or bond fingers where solder balls, solder bumps or bonding wires can be bonded. This circuit board is cost-effectively fabricated by simplified processes, and beneficial in precisely exposing bond pads or bond fingers, thereby significantly improving yield of fabricated circuit boards.

11 Claims, 3 Drawing Sheets

FABRICATION METHOD OF CIRCUIT BOARD

FIELD OF THE INVENTION

The present invention relates to fabrication methods of circuit boards, and more particularly, to a method for fabricating a substrate or a printed circuit board (PCB).

BACKGROUND OF THE INVENTION

In conventional processes for fabricating a circuit board such as substrate or printed circuit board (PCB), a core layer is prepared by fiber glass, epoxy resin, polyimide, FR4 resin or BT resin, etc. Then, at least a copper film is attached to the core layer, and patterned to form predetermined circuitry of conductive traces on the core layer. After that, solder mask is applied over the core layer to cover the conductive traces by conventional techniques such as halftone-printing, roller-coating etc. Then, after being oven-dried and cooled down, undesired part of solder mask is removed by exposure and development processes; remaining solder mask is baked under high temperature and becomes cured to form a protective coating that protects the conductive traces against oxidation or short circuit without affecting electricity thereof.

However, the above conventional circuit board has significant drawbacks. For example, during the process for applying solder mask over the core layer, halftone-printing or roller-coating processes are performed in multiple times for accumulating solder mask with desired thickness; this considerably increases process complexity in fabrication. And, accumulated thickness of solder mask is hardly controlled, which may adversely affect planarity of the circuit board, and electrical connection between electronic components or devices and the circuit board. Moreover, in the baking process under high temperature, due to mismatch in coefficient of thermal expansion (CTE) between solder mask and the core layer of the circuit board, thermal stress would be generated and causes warpage of the circuit board. Furthermore, during coating solder mask over the core layer, air would be possibly trapped in solder mask to form voids, which facilitates the occurrence of popcorn effect in subsequent fabrication processes. In addition, solder mask is poorly adhered with copper traces formed on the core layer; this would easily cause delamination at interface between solder mask and conductive traces, and undesirably affect quality and reliability of the circuit board.

Therefore, there is disclosed another method for fabricating a circuit board. This fabrication method for a circuit board 1 can be carried out by the steps illustrated in FIGS. 3A to 3E. Referring to FIG. 3A, the first step is to prepare a core layer 10 formed with a plurality of copper conductive traces 11 and a plurality of copper-plated vias 12 that penetrate through the core layer 10. The core layer 10 is made of a material same as that used for a conventional circuit board, such as epoxy resin, polyimide resin, FR4 resin, etc.

Referring to FIG. 3B, the next step is to apply a non-solderable material 14 in predetermined thickness over an aluminum film 13; then, the non-solderable material 14 is adapted to be attached to the core layer 10 in a manner as to cover the conductive traces 11. Under predetermined pressure and temperature, the non-solderable material 14 becomes cured and fully fills the vias 12 and other fine holes of the core layer 10, and forms a desirable protective layer for protecting the conductive traces 11 against oxidation or external impact. The non-solderable material 14 is preferably made of a material having coefficient of thermal expansion same as or similar to that of the core layer 10.

Referring to FIG. 3C, a layer of photo resist 15 is applied over an exposed surface of the aluminum film 13. The photo resist 15 is selectively removed by exposure and development processes as to expose predetermined part of the aluminum film 13.

Referring to FIG. 3D, remaining photo resist 15 and exposed part of the aluminum film 13 are etched away by using chemical solvents, so as to expose predetermined part of the non-solderable material 14 that covers bond pad or finger positions of the underneath conductive traces 11. Then, the exposed part of the non-solderable material 14 is removed by plasma etching technique, such that bond pads or bond fingers of the conductive traces 11 can be desirably exposed.

Finally referring to FIG. 3E, remaining aluminum film 13 is chemically etched to completely expose the non-solderable material 14.

The above-fabricated circuit board 1 would desirably eliminate those outlined drawbacks for the foregoing conventional circuit board. For example, one single step of applying non-solderable material 14 allows to desirably achieve predetermined thickness for the non-solderable material 14, thereby effectively reducing complexity and costs in fabrication. Moreover, since the non-solderable material 14 has coefficient of thermal expansion same as or similar to that of the core layer 10, the circuit board 11 can be assured with structural intactness without being warped by thermal stress, thus making production yield greatly improved. In addition, the non-solderable material 14 is firmly attached to the core layer 10 and conductive traces 11 under condition of certain temperature and pressure, and thus air is hardly trapped in the non-solderable material 14, so that popcorn effect or delamination would significantly reduce in occurrence, making quality and reliability of the circuit board 1 firmly assured.

However, the above fabrication method for the circuit board 1 still has considerable drawbacks. First, conductive traces 11 formed on the core layer 10 are covered by multiple-layered structure including the non-solderable material 14, aluminum film 13 and photo resist 15; then, it needs to in turn remove the photo resist 15, aluminum film 13 and non-solderable material 14, so as to expose predetermined part of the conductive traces 11, thereby making process complexity and costs in fabrication undesirably increased.

Moreover, as conductive traces 11 are covered thereon by the non-solderable material 14, aluminum film 13 and photo resist 15, it is difficult to visually recognize predetermined part of the conductive traces 11 to be exposed through such multi-layer structure. In order to precisely position corresponding part of the photo resist 15 aligned with the part of the conductive traces 11 to be exposed, X-ray fluoroscopy is usually adopted to determine fiducial marks on the photo resist 15. However, X-ray fluoroscopy still possibly causes positioning inaccuracy up to ±75 $\mu$m, making etched part of the aluminum film 13 and non-solderable material 14 not precisely positioned in correspondence with the predetermined exposed part of the conductive traces 11, which deteriorates production yield of fabrication circuit boards 1.

In addition, the non-solderable material 14 is selectively removed by the plasma-etching technique to form a plurality of openings where predetermined positions of the conductive traces 11 are exposed for use as bond pads or bond fingers, allowing solder balls, solder bumps or wires to be subsequently bonded to the exposed bond pads or fingers. These openings formed by the plasma-etching technique are SMD (solder mask define) openings; as shown in FIG. 3E, each SMD opening is dimensioned smaller in surface area than the underneath conductive trace 11, and thus, part of the conductive trace 11 is unexposed and covered under the non-solderable material 14. As such, adjacent openings are at least spaced apart from each other by the distance of unexposed part of adjacent conductive traces 11; this would hardly reduce the distance between adjacent openings and pitch spacing between neighboring bond pads or bond fingers, making the circuit board 1 not suitably used for accommodating fine-pitch or high-density arrangement of solder balls, bumps or wires.

Therefore, how to develop a novel fabrication method for a circuit board to eliminate the above drawbacks, is a critical problem to solve.

SUMMARY OF THE INVENTION

A primary objective of the present invention is to provide a fabrication method for a circuit board, whereby the circuit board is cost-effectively fabricated by simplified processes, and allows to precisely expose predetermined positions (bond pads or bond fingers) of conductive traces formed on the circuit board, thereby greatly improving yield of fabricated circuit boards.

Another objective of the invention is to provide a fabrication method for a circuit board, which allows to reduce pitch distance between adjacent exposed positions (bond pads or bond fingers) of conductive traces formed on the circuit board, making fabricated circuit boards suitably mounted with high density of solder balls, solder bumps or wires thereon.

In accordance with the above and other objectives, the present invention proposes a fabrication method for a circuit board, comprising the steps of: preparing a core layer that is formed with a plurality of conductive traces on at least a surface thereof, each of the conductive traces being formed with a terminal, and applying a suitable amount of photo resist respectively on the terminals of the conductive traces; applying a non-solderable material over the surface of the core layer where the conductive traces are formed, in a manner that the non-solderable material covers the surface of the core layer exclusive of the photo resist, and the non-solderable material is adapted to be surface-flush with the photo resist, so as to allow the photo resist to be exposed from the non-solderable material; and removing the photo resist from the core layer to expose the terminals of the conductive traces.

The above-fabricated circuit board is suitably used as a substrate for accommodating integrated circuits, or a printed circuit board (PCB); and the circuit board can provide significant benefits. First, a protective layer for protecting conductive traces is formed by a single step of applying a non-solderable material over the core layer, thereby making fabrication processes of the circuit board effectively simplified; unlike the prior art of forming multi-layered structure containing non-solderable material, aluminum film and photo resist on a core layer, which aluminum film and photo resist are in turn removed by exposure-development and chemical etching processes to expose the non-solderable material, thereby greatly increasing process complexity in fabrication. Moreover, during fabrication of the circuit board of the invention, as photo resist is in advance applied on terminals (bond pads or bond fingers) of conductive traces, and the photo resist is not further covered by the non-solderable material, bond pads or bond fingers can be directly exposed simply by removing the photo resist. This thereby significantly simplifies fabrication processes and reduces fabrication costs for the circuit board of the invention; unlike the prior art, photo resist, aluminum film and non-solderable material are required to be sequentially removed to expose bond pads or bond fingers.

In addition, the circuit board of the invention is further beneficial as to precisely expose terminals of the conductive traces. As photo resist is directly applied in advance to cover the terminals of the conductive traces, thus bond pads or bond fingers can be precisely exposed by removing the photo resist to directly expose the terminals of the conductive traces. This therefore eliminates the drawback in the prior art of positioning inaccuracy at circuit or trace exposure even through the use of X-ray technology.

In another embodiment, openings formed through non-solderable material allow terminals of conductive traces to be completely exposed to the openings; these openings are NSMD (non-solder mask define) openings. As-compared to SMD (solder mask define) openings formed for a conventional circuit board in the prior art, since part of trace terminals is covered by non-solderable material, adjacent SMD openings are spaced apart by certain distance that is hardly reduced; spacing between adjacent NSMD openings of the invention can be further reduced by decreasing the intermediate non-solderable material, allowing pitch distance for bond pads or bond fingers to be desirably reduced, thereby making the circuit board of the invention able to be mounted with high density of solder balls, bumps or wires, so that the circuit board of the invention can be suitably applied to highly integrated electronic products.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENT

The following description is made with reference to FIGS. 1A–1C and FIGS. 2A–2C for detailing the preferred embodiments of a fabrication method for a circuit board proposed in the present invention. The drawings illustratively show components or parts only relating to the disclosure of this invention; it should be understood that, these components or parts are not drawn in real sizes or numbers, and the circuit board of this invention is structurally more complex in practical fabrication.

First Preferred Embodiment

Figure 1A:
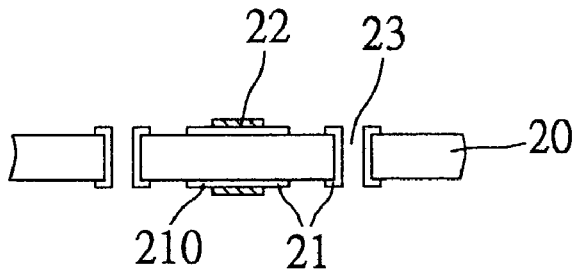
FIGS. 1A–1C are cross-sectional schematic diagrams showing process steps involved in a fabrication method for a circuit board of a first preferred embodiment of the invention.
Figure 1B:
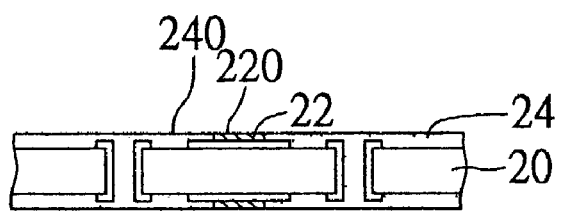
Figure 1C:
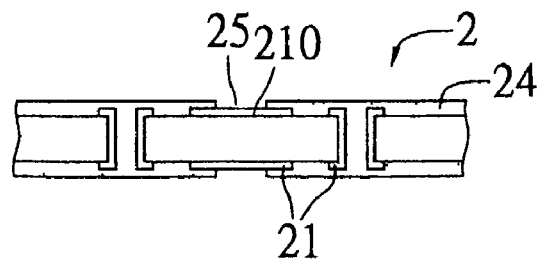

FIGS. 1A to 1C illustrate process steps involved in a fabrication method for a circuit board 2 of the first embodiment of the invention.

Referring to FIG. 1A, the first step is to prepare a core layer 20, with predetermined circuitry of conductive traces 21 being formed on two opposing surfaces of the core layer 20. The conductive traces 21 are defined with a plurality of terminals 210 that serve as bond pads or bond fingers where solder balls, solder bumps or bonding wires (not shown) are bonded for electrical connection purpose. And, an insulating material 22 such as photo resist is applied on each of the terminals 210 of the conductive traces 21.

The core layer 20 can be made of a resin material, such as epoxy resin, polyimide resin, FR4 resin, etc. And, a plurality of vias 23 are formed to penetrate through the core layer 20. In fabrication, a copper film is respectively attached to each surface of the core layer 20, and patterned to define the conductive traces 21; also, the plurality of vias 23 are plated with copper on inner walls thereof, for electrically interconnecting the conductive traces 21 formed on the opposed surface of the core layer 20. Since fabrication processes for the core layer 20 and conductive traces 21 are conventional in the art, they are not to be further detailed herein.

Referring next to FIG. 1B, a printing or molding technique is utilized for applying a non-solderable material 24 over the core layer 20 in a manner as to cover the conductive traces 21 exclusive of the insulating material 22, allowing the insulating material 22 applied on the terminals 210 of the conductive traces 21 to be exposed from the non-solderable material 24. And, the non-solderable material 24 is adapted to be surface-flush with the insulating material 22, wherein an exposed surface 220 of the insulating material 22 is level with an exposed surface 240 of the non-solderable material 24. Since printing and molding techniques are conventional in the art, no further description thereto is to be detailed herein.

The non-solderable material 24 completely covers surface area of the core layer 20 and the conductive traces 21, except for the insulating material 22. And, the, non-solderable material 24 is adapted to be firmly attached to the core layer 20 in a manner as to completely fill the vias 23 and other fine holes of the core layer 20. As a result, this makes the non-solderable material 24 form a protective layer for protecting the conductive traces 21 on the core layer 20 against oxidation and external impact. Moreover, the non-solderable material 24 is made of a resin material, such as epoxy resin, polyimide resin, BT resin, FR4 resin, FR5 resin, or combination thereof. Preferably, the non-solderable material 24 has coefficient of thermal expansion (CTE) similar to or same as that of the core layer 20.

Finally referring to FIG. 1C, the insulating material 22 is etched away by using conventional chemical solvents; this forms a plurality of openings 25 penetrating through the non-solderable material 24, by which the terminals 210 of the conductive traces 21 covered with the insulating material 22 are exposed to the openings 25. The exposed terminals 210 serve as bond pads or bond fingers to be bonded with solder balls, solder bumps or bonding wires for electrical connection purpose, or are plated thereon with other metal for protecting copper against oxidation. Since the chemical etching process is conventional in the art, it is not to be further described herein.

The above-fabricated circuit board 2 is suitably used as a substrate for accommodating integrated circuits, or a printed circuit board (PCB); and the circuit board 2 can provide significant benefits. First, a protective layer for protecting conductive traces 21 is formed by a single step of applying a non-solderable material 24 over the core layer 20, thereby making fabrication processes of the circuit board 2 effectively simplified; unlike the prior art of forming multi-layered structure containing non-solderable material, aluminum film and photo resist on a core layer, which aluminum film and photo resist are in turn removed by exposure-development and chemical etching processes to expose the non-solderable material, thereby greatly increasing process complexity in fabrication. Moreover, during fabrication of the circuit board 2 of the invention, as an insulating material (photo resist) 22 is in advance applied on terminals 210 (bond pads or bond fingers) of conductive traces 21, and the insulating material 22 is not further covered by the non-solderable material 24, bond pads or bond fingers can be directly exposed simply by removing the insulating material 22. This thereby significantly simplifies fabrication processes and reduces fabrication costs for the circuit board 2 of the invention; unlike the prior art, photo resist, aluminum film and non-solderable material are required to be sequentially removed to expose bond pads or bond fingers.

In addition, the circuit board 2 of the invention is further beneficial as to precisely expose terminals 210 of the conductive traces 21. As the insulating material 22 is directly applied in advance to cover the terminals 210 of the conductive traces 21, thus bond pads or bond fingers can be precisely exposed by removing the insulating material 22 to directly expose the terminals 210 of the conductive traces 21. This therefore eliminates the drawback in the prior art of positioning inaccuracy at circuit or trace exposure even through the use of X-ray technology.

Second Preferred Embodiment

Figure 2A:
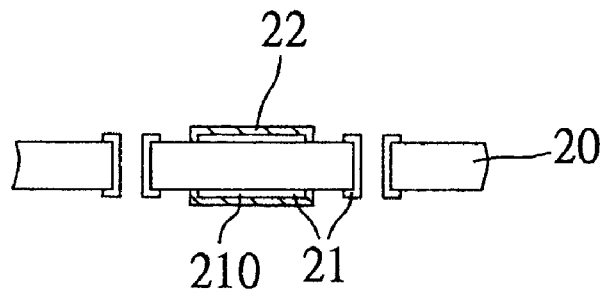
FIGS. 2A–2C are cross-sectional schematic diagrams showing process steps involved in a fabrication method for a circuit board of a second preferred embodiment of the invention.
Figure 2B:
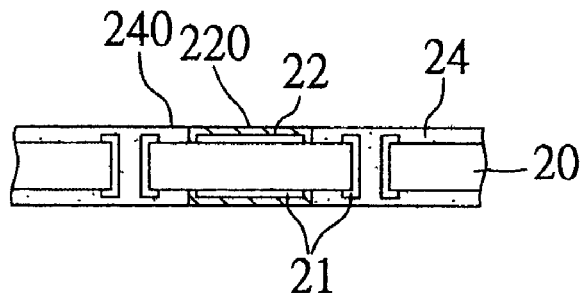
Figure 2C:
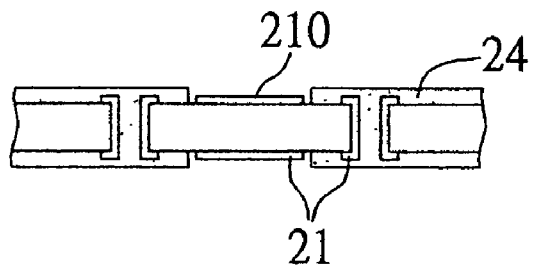
Figure 3A:
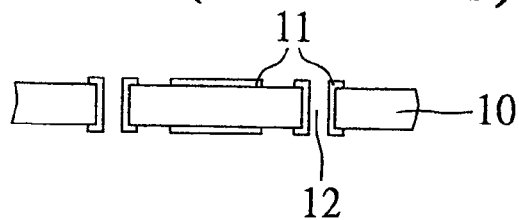
FIGS. 3A–3E (PRIOR ART) are cross-sectional schematic diagrams showing conventional fabrication processes for a circuit board.
Figure 3B:
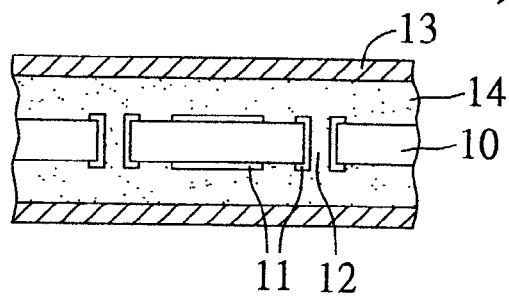
Figure 3C:
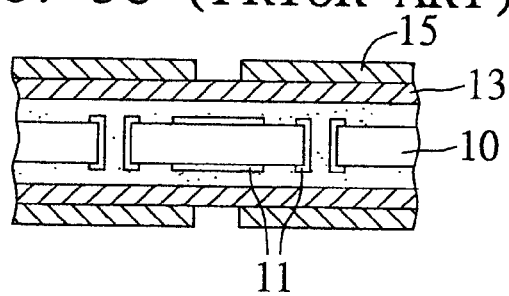
Figure 3D:
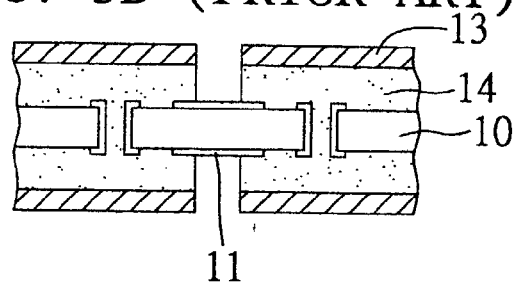
Figure 3E:
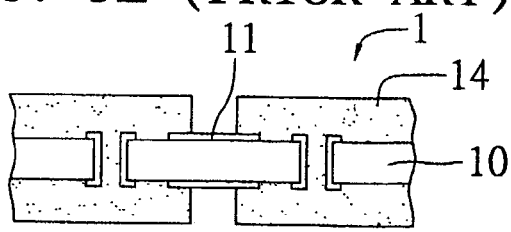

FIGS. 2A to 2C illustrate the second embodiment of the fabrication method for a circuit board 2 of the invention. This embodiment is similar to the previous first embodiment; thus, components or parts in this embodiment are designated by the same reference numerals as those in the first embodiment.

Referring first to FIG. 2A, a core layer 20 formed with conductive traces 21 is prepared, each of the conductive traces 21 being defined with a terminal 210. And, an insulating material 22 e.g. photo resist is applied on the terminal 210 of each of the conductive traces 21 in a manner as to entirely cover the terminal 210.

Referring to FIG. 2B, a non-solderable material 24 is applied over the core layer 20 in a manner as to hermetically cover the conductive traces 21 formed on the core layer 20, with the insulating material 22 being exposed to outside of the non-solderable material 24. And, the non-solderable material 24 is adapted to be surface-flush with the insulating material 22, allowing an exposed surface 240 of the non-solderable material 24 to be level with an exposed surface 220 of the insulating material 22.

Referring finally to FIG. 2C, the insulating material 22 is removed, allowing the terminals 210 of the conductive traces 21 entirely covered with the insulating material 22 to be completely exposed from the non-solderable material 24. The exposed terminals 210 serve as bond pads or bond fingers to be bonded with solder balls, solder bumps or bonding wires for electrical connection purpose, or are plated thereon with other metal for protecting copper against oxidation.

This embodiment is characterized in that, terminals 210 of the conductive traces 21 are first completely encapsulated by an insulating material (photo resist) 22, and then, the insulating material 22 is removed to form openings through the non-solderable material 24, allowing terminals 210 of the conductive traces 21 to be entirely exposed to the openings.

These openings with complete exposure of trace terminals 210 are NSMD (non-solder mask define) openings that cannot be formed in the use of conventional plasma etching technology.

Therefore, besides multiple advantages provided in the above first embodiment, this embodiment is further beneficial as to reduce pitch spacing (fine pitch) between adjacent bond pads or bond fingers. Without having to use a conventional plasma etching process, NSMD openings can be formed through the non-solderable material 24, with terminals 210 of the conductive traces 21 to be completely exposed to the NSMD openings. As compared to SMD (solder mask define) openings formed for a conventional circuit board in the prior art, since part of trace terminals is covered by non-solderable material, adjacent SMD openings are spaced apart by certain distance that is hardly reduced; spacing between adjacent NSMD openings of the invention can be further reduced by decreasing the intermediate non-solderable material 24, allowing pitch distance for bond pads or bond fingers to be desirably reduced, thereby making the circuit board 2 of the invention able to be mounted with high density of solder balls or wires, so that the circuit board 2 of the invention can be suitably applied to highly integrated electronic products.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A fabrication method of a circuit board, comprising the steps of:

preparing a core layer that is formed with a plurality of conductive traces on at least one surface thereof, each of the conductive traces being formed with a terminal;

applying an insulating material over a part of the surface of the core layer where the terminals are formed, so as to cover the terminal of each of the conductive traces;

applying a non-solderable material on the other part of the surface of the core layer such that the non-solderable material is surface-flush with the insulating material so as to allow the insulating material to be exposed from the non-solderable material; and removing the insulating material to expose the terminals of the conductive traces.

2. The fabrication method of claim 1, wherein the insulating material is photo resist.

3. The fabrication method of claim 1, wherein the insulating material partly covers the terminal of the conductive trace.

4. The fabrication method of claim 1, wherein the insulating material entirely covers the terminal of the conductive trace.

5. The fabrication method of claim 1, wherein the terminal is a bond pad.

6. The fabrication method of claim 1, wherein the terminal is a bond finger.

7. The fabrication method of claim 1, wherein the non-solderable material has coefficient of thermal expansion similar to that of the core layer.

8. The fabrication method of claim 1, wherein the non-solderable material has coefficient of thermal expansion same as that of the core layer.

9. The fabrication method of claim 1, wherein the non-solderable material is applied over the surface of the core layer by printing technique.

10. The fabrication method of claim 1, wherein the non-solderable material is applied over the surface of the core layer by molding technique.

11. The fabrication method of claim 1, wherein the insulating material is removed by etching technique of using chemical solvents.

* * * * *